(12) United States Patent
Beers et al.

(10) Patent No.: US 10,485,149 B2
(45) Date of Patent: Nov. 19, 2019

(54) COMPOSITE FORMULATION AND COMPOSITE ARTICLE

(71) Applicant: Tyco Electronics Corporation, Berwyn, PA (US)

(72) Inventors: Megan Hoarfrost Beers, Belmont, CA (US); Jialing Wang, Mountain View, CA (US); Jaydip Das, Cupertino, CA (US); Richard B. Lloyd, Sunnyvale, CA (US); James Toth, San Carlos, CA (US); Ting Gao, Palo Alto, CA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/275,100

(22) Filed: Sep. 23, 2016

(65) Prior Publication Data

US 2018/0092258 A1    Mar. 29, 2018

(51) Int. Cl.
| | |
|---|---|
| *H05K 9/00* | (2006.01) |
| *B32B 27/08* | (2006.01) |
| *B32B 27/20* | (2006.01) |
| *B32B 27/30* | (2006.01) |
| *B32B 27/34* | (2006.01) |

(Continued)

(52) U.S. Cl.
CPC .......... *H05K 9/0081* (2013.01); *B32B 27/08* (2013.01); *B32B 27/20* (2013.01); *B32B 27/304* (2013.01); *B32B 27/34* (2013.01); *C08K 3/08* (2013.01); *C08K 9/10* (2013.01); *H05K 9/009* (2013.01);

(Continued)

(58) Field of Classification Search
CPC .. H05K 9/0081; H05K 9/0083; H05K 9/0088; B32B 27/08; B32B 27/304; B32B 27/34; B32B 2307/212; C08K 2201/001
See application file for complete search history.

(56) References Cited

U.S. PATENT DOCUMENTS

| | | | |
|---|---|---|---|
| 2003/0015334 A1* | 1/2003 | Clement | .............. H05K 5/0243 174/50 |
| 2010/0140534 A1 | 6/2010 | Kim et al. | |

(Continued)

FOREIGN PATENT DOCUMENTS

EP    0185783 A1    7/1986

OTHER PUBLICATIONS

International Search Report dated Dec. 6, 2017, for corresponding International Application No. PCT/US2017/053090.

*Primary Examiner* — Hai Vo

(57) ABSTRACT

A composite formulation and a composite article are provided. The composite article includes at least two layers of a composite formulation including a polymer matrix and conductive particles distributed within the polymer matrix, the conductive particles forming, by volume, between 20% and 50% of the composite formulation. The conductive particles in each of the at least two layers include at least one morphology selected from the group consisting of fibrous, dendritic, and flake, and the morphology of the conductive particles in one of the at least two layers differs from the morphology of the conductive particles in another one of the at least two layers. The composite formulation includes a polymer matrix and between 30% and 45%, by volume, tin-coated copper conductive particles at a copper/tin ratio of between 3/1 and 3/2, the conductive particles including at least two morphologies selected from the group consisting of fibrous, dendritic, and flake.

9 Claims, 9 Drawing Sheets

(51) Int. Cl.
  *C08K 3/08* (2006.01)
  *C08K 9/10* (2006.01)
  *C08K 7/00* (2006.01)
  *H01B 1/22* (2006.01)
(52) U.S. Cl.
  CPC ... *B32B 2264/105* (2013.01); *B32B 2307/212* (2013.01); *C08K 2003/085* (2013.01)

(56) References Cited

U.S. PATENT DOCUMENTS

| | | |
|---|---|---|
| 2014/0154496 A1 | 6/2014 | Sang et al. |
| 2015/0144849 A1* | 5/2015 | Kohira ............... C22C 9/02 252/512 |
| 2016/0012932 A1 | 1/2016 | Holm et al. |
| 2016/0012933 A1 | 1/2016 | Das et al. |

* cited by examiner

COMPOSITE FORMULATION AND COMPOSITE ARTICLE

FIELD OF THE INVENTION

The present invention is directed to a composite formulation and a composite article. More particularly, the present invention is directed to a conductive composite formulation and a conductive composite article.

BACKGROUND OF THE INVENTION

Materials that perform electromagnetic interference (EMI) shielding functions are useful in a variety of electronic components, cables, assemblies, and other devices. These materials usually provide EMI shielding by reducing or eliminating the passage of electromagnetic radiation therethrough. In general, the EMI shielding effectiveness of a material increases with increasing electrical conductivity, especially at low frequency. In view thereof, highly conductive materials such as metallic sheets, meshes, foams, and other metallic materials have traditionally been used for EMI shielding. However, most metallic materials are heavy and/or difficult to process, which increases manufacturing cost and limits design flexibility.

One possible alternative to current EMI shielding materials includes a conductive polymeric composite. Certain conductive polymeric composites are electrically conductive and may be processed via traditional polymer processing techniques, such as extrusion and injection molding. However, there are challenges associated with using conductive composites for EMI shielding applications. For example, in most instances, increasing filler loading simultaneously increases conductivity and decreases mechanical properties. The decrease in mechanical properties associated with the increase in conductivity creates a tradeoff between processability/mechanical strength and EMI shielding effectiveness.

Additionally, polymeric composites typically exhibit a complex dependence on frequency. The insulating nature of the polymer component of the composites results in lower conductivity of the composites compared with the metals, and subsequently lower shielding effectiveness in the low frequency range. Micrometer-scale conductive particle fillers are embedded in the polymer leading to low-conductivity apertures on the micrometer length scale. The exact size, shape, and orientation of the particles influences the distribution of low-conductivity apertures, which in turn influences the shielding effectiveness in the high-frequency range. In some cases, the micrometer-scale particles provide the advantage of smaller apertures compared to those in conventional metal shields such as braids, leading to higher shielding effectiveness in the high frequency range. In other cases, the apertures lead to very poor shielding effectiveness in the high frequency range. The frequency dependence of shielding performance in polymeric composite materials may be exacerbated in thin geometries, which is particularly challenging as even the shielding effectiveness of homogeneous materials decreases monotonically with decreasing thickness.

A composite formulation and a composite article that show one or more improvements in comparison to the prior art would be desirable in the art.

BRIEF DESCRIPTION OF THE INVENTION

In an embodiment, a composite article includes at least two layers of a composite formulation, the composite formulation of each layer including a polymer matrix and conductive particles distributed within the polymer matrix, the conductive particles including a concentration of, by volume, between 20% and 50% of the composite formulation. The conductive particles in each of the at least two layers include at least one morphology selected from the group consisting of fibrous, dendritic, and flake, and the morphology of the conductive particles in one of the at least two layers differs from the morphology of the conductive particles in another one of the at least two layers.

In another embodiment, a composite article includes a component and a layer of a composite formulation positioned over the component, the composite formulation including a polymer matrix and conductive particles distributed within the polymer matrix, the conductive particles including a concentration of, by volume, between 20% and 50% of the composite formulation. A thickness of the layer is equal to or less than 0.75 mm, the conductive particles include at least two morphologies selected from the group consisting of fibrous, dendritic, and flake, and the layer of the composite formulation provides an electromagnetic shielding effectiveness of at least 40 dB over a frequency range of from 0.01 GHz to 25 GHz.

In another embodiment, a composite formulation includes a polymer matrix and tin-coated copper conductive particles at a copper/tin ratio of between 3/1 and 3/2, the tin-coated copper conductive particles including a concentration of, by volume, between 30% and 45% of the composite formulation. The tin-coated copper conductive particles are distributed within the polymer matrix and include at least two morphologies selected from the group consisting of fibrous, dendritic, and flake.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

The present invention provides exemplary composite formulations and articles that may be used in various EMI applications. These exemplary composite formulations provide numerous advantages, including: (i) increased EMI shielding characteristics; (ii) increased or enhanced processability that permits formation of geometrically complex EMI shielded articles; (iii) decreased thickness as compared to other formulations; and (iv) high EMI shielding effectiveness in a broad frequency range. The present invention also includes exemplary composite articles providing these and other advantages.

Figure 1:
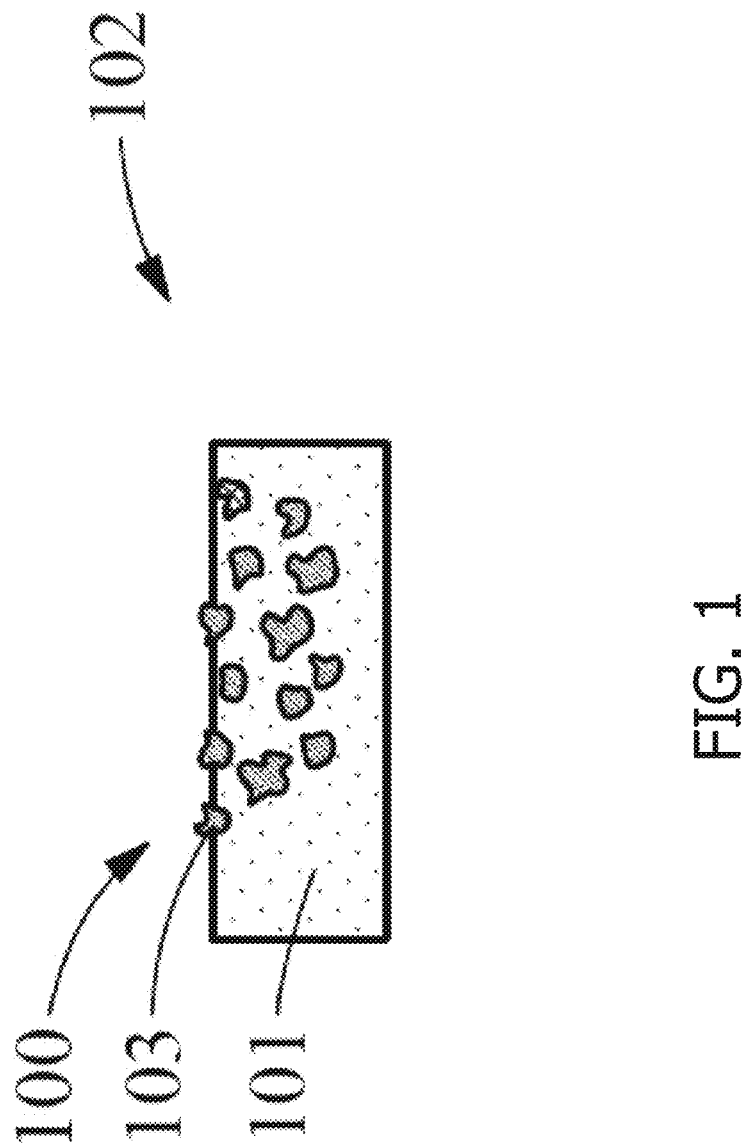
FIG. 1 is a schematic view of a composite formulation having additives distributed in a polymer matrix, according to an embodiment of the disclosure.

Referring to FIG. 1, in one embodiment, a composite formulation 100 includes a polymer matrix 101 having conductive particles 103 blended and/or distributed therein. In another embodiment, the composite formulation 100 includes a process aid and/or any other suitable constituents. For example, in a further embodiment, the process aid is blended within the polymer matrix 101, for example, at a concentration, by volume, of between 1% and 10%, between 6% and 8%, between 7% and 8%, 6%, 7%, 7.5%, 8%, or any suitable combination, sub-combination, range, or sub-range therein. One suitable process aid is a lubricant, such as, dioctyl sebacate. Other suitable constituents capable of being blended within the polymer matrix 101 include, but are not limited to, a filler (for example, to alter rheological or mechanical properties), a curing agent (for example, for solvent-based curing and/or for radiation curing), a dispersant, a plasticizer, a wetting agent, a defoamer, a dye or coloring agent, or a combination thereof.

The polymer matrix 101 includes any suitable material capable of having the conductive particles 103 blended and/or distributed therein. Additionally or alternatively, the polymer matrix 101 permits the composite formulation 100 to be extruded and/or molded (e.g., injection molded, compression molded, transfer molded, blow molded, thermomolded, sintered, or a combination thereof). Suitable polymer matrix materials include, but are not limited to, acrylonitrile butadiene styrene (ABS); polyamide (PA) (e.g., PA6, PA6,6, PA10,10, and/or PA12); polyethylene (e.g., high, medium, low, and/or linear low density polyethylene, such as, metallocene-catalyzed polyethylene (m-LLDPE)); poly(ethylene-co-vinyl acetate) (EVA); polypropylene (PP); polyvinylidene fluoride (PVDF); copolymers of vinylidene fluoride (VDF) and hexafluoropropylene (HFP); terpolymers of vinylidene fluoride (VDF), HFP and/or tetrafluoroethylene (TFE), fluorinated ethylene propylene, ethylene tetrafluoroethylene, polytetrafluoroethylene, other suitable fluorinated matrices, or a combination thereof; polylactic acid (PLA); polyurethane (PU) and/or thermoplastic polyurethane (TPU); polyetherimide (PEI); polyether sulfone (PES); polycarbonate (PC); polybutylene terephthalate (PBT); polyethylene terephthalate (PET); liquid crystalline polymer (LCP); any other suitable thermoplastic and/or thermoplastic elastomer; or a combination thereof.

The conductive particles 103 blended and/or distributed in the polymer matrix 101 include, but are not limited to, metals, including tungsten (W), nickel (Ni), copper (Cu), tin (Sn), silver (Ag), titanium (Ti), or molybdenum (Mo); alloys or intermetallics; metallic ceramics, including tungsten carbide (WC) or titanium carbide (TiC); carbon-based materials, including carbon (C), carbon black, or graphite; or a combination thereof. Suitable temperatures for blending the conductive particles 103 within the polymer matrix 101 include temperatures above the polymer melting point temperature and at which metal-metal diffusion occurs to give rise to intermetallic or alloy phases or compositions (when applicable), such as, the intermetallic formation temperature. Suitable temperature ranges for the blending include, but are not limited to, less than 300° C., less than 230° C., less than 220° C., less than 210° C., between 210° C. and 260° C., between 150° C. and 230° C., between 180° C. and 220° C., between 180° C. and 210° C., between 190° C. and 200° C., between 195° C. and 205° C., or any suitable combination, sub-combination, range, or sub-range therein.

In one embodiment, forming the composite formulation 100 includes compounding the polymer matrix 101 and the conductive particles 103. For example, in another embodiment, compounding includes melting a tin powder to coat copper particles and form Sn-coated Cu particles, where Cu—Sn intermetallic phases are formed at the interface of the tin powder and the copper particles. The copper and tin particles are provided at any suitable ratio for providing desired conductivity, to reduce or eliminate oxidation of the copper particles, and/or to decrease a contact resistance between copper particles. Suitable ratios include, but are not limited to, Cu/Sn ratios, by volume, of between 1/2 and 4/1, between 1/2 and 5/2, between 1/1 and 2/1, or any other combination, sub-combination, range, or sub-range thereof.

The blending, distributing, and/or compounding of the conductive particles 103 within the polymer matrix 101 increases a conductivity of the composite formulation 100, as compared to the polymer matrix 101 alone, which increases the EMI shielding capability of the composite formulation 100. The conductive particles 103 are provided at any suitable concentration for providing desired conductivity and/or processability of the composite formulation 100. Suitable concentrations of the conductive particles 103 in the composite formulation 100 include, by volume, between 20% and 50%, between 30% and 50%, between 35% and 45%, between 38% and 42%, between 39% and 41%, or any combination, sub-combination, range, or sub-range thereof. Suitable conductivities of the composite formulation 100, expressed as bulk resistivity, include, but are not limited to, 0.1 Ω-cm or less, $10^{-2}$ Ω-cm or less, $10^{-3}$ Ω-cm or less, $10^{-4}$ Ω-cm or less, between 0.1 Ω-cm and $10^{-5}$ Ω-cm, between $10^{-2}$ Ω-cm and $10^{-5}$ Ω-cm, between $10^{-3}$ Ω-cm and $10^{-4}$ Ω-cm, or any combination, sub-combination, range, or sub-range thereof. Other suitable conductivities of the composite formulation 100 include, but are not limited to, one or more of the bulk electrical conductivities listed in Table 1 below.

TABLE 1

| Material | Bulk Electric Conductivity (S/cm) |
|---|---|
| 20% 3/2 Dendritic Cu/Sn in Nylon 6,6 | 5.9E1 |
| 30% 3/2 Dendritic Cu/Sn in Nylon 6,6 | 2.9E2 |
| 40% 3/2 Dendritic Cu/Sn in Nylon 6,6 | 1.5E3 |
| 20% 3/2 Fibrous Cu/Sn in Nylon 6,6 | 1.1E4 |
| 30% 3/2 Fibrous Cu/Sn in Nylon 6,6 | 1.9E4 |
| 40% 3/2 Fibrous Cu/Sn in Nylon 6,6 | 8.3E3 |
| 40% 3/2 Dendritic Cu/Sn in Nylon 6 | 1.7E3 |
| 40% 1.5/1.5/2 Dendritic Cu/Fibrous Cu/Sn in Nylon 6 | 8.5E3 |
| 40% 3/2 Fibrous Cu/Sn in Nylon 6 | 3.6E4 |
| 40% 3/2 Dendritic Cu/Sn in PVDF | 2.3E3 |
| 40% 1.5/1.5/2 Dendritic Cu/Fibrous Cu/Sn in PVDF | 7.6E3 |
| 40% 3/2 Fibrous Cu/Sn in PVDF | 1.9E4 |

At any particular concentration, the characteristics of the conductive particles 103, such as type, size, shape, distribution, and/or morphology, at least partially determine the conductivity and/or EMI shielding properties of the composite formulation 100 at that concentration. For example, without wishing to be bound by theory, it is believed that the aspect ratio and effective surface area of the conductive particles 103 affect the percolation threshold of the composite formulation 100. The shapes and/or morphologies of the conductive particles 103 that include relatively higher aspect ratios and/or effective surface areas provide lower percolation thresholds, which increase electrical conductivity of the composite formulation 100 at lower concentrations of the conductive particles 103. In another example, and again without wishing to be bound by theory, it is believed that the aspect ratio and particle size of the conductive particles 103 affect how the EMI shielding properties of the composite formulation 100 depend on frequency. The conductive particles 103 with lower aspect ratios and/or smaller particle sizes (for example, dendrites versus fibers) include smaller gaps between particles, which is believed to provide better EMI shielding at higher frequencies.

Figure 2:
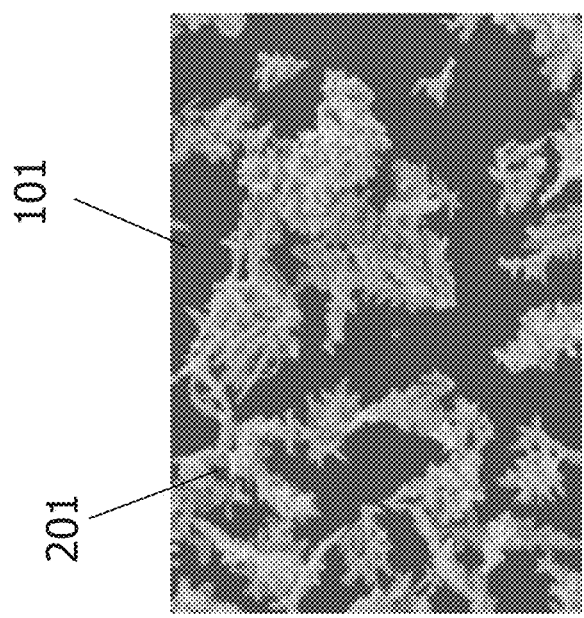
FIG. 2 shows a scanning electron micrograph of copper dendrites that are constituents of conductive particles, according to an embodiment of the disclosure.

Suitable morphologies of the conductive particles 103 include, but are not limited to, spherical, fibrous, dendritic 201 (FIG. 2), flake 301 (FIG. 3), any other morphology capable of forming a conductive network within the polymer matrix 101, or a combination thereof. Average diameters of the dendritic particles 201, an example of which is shown in FIG. 2, include, but are not limited to, 100 micrometers (μm), 75 μm, 50 μm, 25 μm, 10 μm, 5 μm, 2 μm, less than 100 μm, less than 80 μm, between 10 μm and 100 μm, between 10 μm and 80 μm, between 10 μm and 50 μm, between 10 μm and 30 μm, between 20 μm and 30 μm, or any suitable combination, sub-combination, range, or sub-range therein. Average lengths of the dendritic particles 201 include, but are not limited to, 1000 μm, 500 μm, 300 μm, 250 μm, 100 μm, 80 μm, between 10 μm and 500 μm, between 10 μm and 300 μm, between 10 μm and 250 μm, between 10 μm and 160 μm, between 40 μm and 120 μm, between 60 μm and 100 μm, or any suitable combination, sub-combination, range, or sub-range thereof. Average specific surface areas of the dendritic particles 201 include, but are not limited to, between 700 cm$^2$/g and 2300 cm$^2$/g, between 1000 cm$^2$/g and 1800 cm$^2$/g, between 1200 cm$^2$/g and 1600 cm$^2$/g, or any combination, sub-combination, range, or sub-range thereof. For example, one suitable dendritic particle 201 includes an average diameter of about 26 μm, an average length of about 80 μm, and an average specific surface area of about 1400 cm$^2$/g.

Average diameters of the fibrous particles include, but are not limited to, 100 μm, 75 μm, 50 μm, 25 μm, 10 μm, 5 μm, 2 μm, less than 100 μm, less than 80 μm, between 10 μm and 100 μm, between 10 μm and 80 μm, between 10 μm and 50 μm, between 10 μm and 30 μm, between 20 μm and 30 μm, or any suitable combination, sub-combination, range, or sub-range therein. Average lengths of the fibrous particles include, but are not limited to, 2000 μm, 1500 μm, 1000 μm, 750 μm, 500 μm, between 10 μm and 2000 μm, between 10 μm and 1500 μm, between 50 μm and 1500 μm, between 100 μm and 1500 μm, between 250 μm and 1500 μm, between 500 μm and 1500 μm, between 750 μm and 1250 μm, between 900 and 1100 μm, or any suitable combination, sub-combination, range, or sub-range thereof. For example, one suitable fibrous particle includes an average diameter of about 25 μm and an average length of about 1000 μm.

Figure 3:
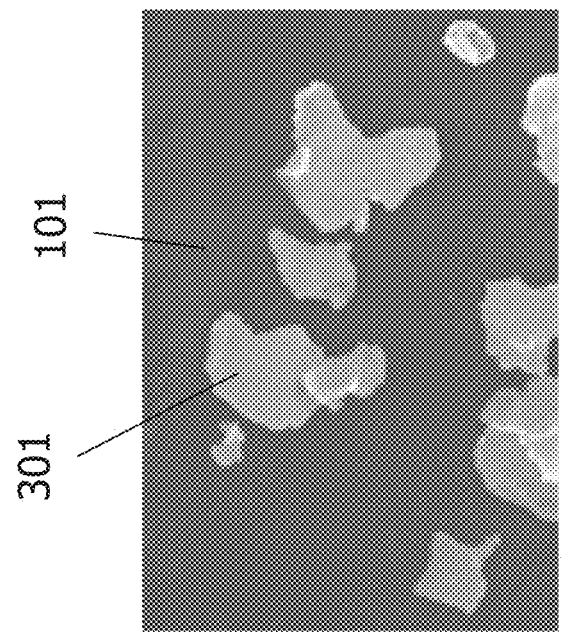
FIG. 3 shows a scanning electron micrograph of copper flakes that are constituents of conductive particles, according to an embodiment of the disclosure.

Average thicknesses of the flakes 301, an example of which is shown in FIG. 3, include, but are not limited to, 100 μm, 75 μm, 50 μm, 25 μm, 10 μm, 5 μm, 2 μm, 1 μm, less than 100 μm, less than 80 μm, less than 50 μm, less than 25 μm, less than 10 μm, less than 5 μm, less than 1 μm, less than 0.5 μm, between 0.1 μm and 100 μm, between 0.1 μm and 80 μm, between 0.1 μm and 50 μm, between 0.1 μm and 30 μm, between 0.1 μm and 10 μm, between 0.1 μm and 5 μm, between 0.3 and 2 μm, or any suitable combination, sub-combination, range, or sub-range therein. Average diameters of the flakes 301 include, but are not limited to, 1000 μm, 500 μm, 300 μm, 250 μm, 100 μm, 80 μm, 25 μm, between 1 μm and 500 μm, between 10 μm and 300 μm, between 10 μm and 250 μm, between 10 μm and 100 μm, between 10 μm and 80 μm, between 40 μm and 60 μm, between 1 μm and 40 μm, between 1 μm and 20 μm, between 1 μm and 10 μm, between 1 μm and 5 μm, or any suitable combination, sub-combination, range, or sub-range thereof.

In one embodiment, the fibrous particles and/or flakes 301 include increased aspect ratio as compared to the dendritic particles 201. This increased aspect ratio of the fibrous particles and/or flakes 301 provides increased conductivity in the composite formulation 100, as compared to the composite formulation 100 including the dendritic particles 201. At lower frequencies, such as, but not limited to, up to about 0.01 GHz, the increased conductivity provided by the fibrous particles and/or flakes 301 provides high EMI shielding effectiveness and/or very high EMI shielding effectiveness in the composite formulation 100. As used herein, the term "high EMI shielding effectiveness" refers to any shielding effectiveness level of 40 dB or more for a sample thickness of 0.5 mm in the frequency range of 10 MHz to 10 GHz. As used herein, the term "very high EMI shielding effectiveness" refers to any shielding effectiveness level of 60 dB or more for a sample thickness of 0.5 mm in the frequency range of 10 MHz to 10 GHz. EMI shielding effectiveness values provided in this document were measured on pressed sample disks 39-50 mm in diameter and with the specified thickness, using an Agilent Technologies PNA Network Analyzer and a home-made test fixture. Reference samples as per ASTM D4935 were measured to correct for losses not due to shielding. The test fixture consisted of a flanged coaxial test cell similar to the ASTM D4935 fixture, but with smaller dimensions to allow higher frequency operation. The usable frequency range for the test fixture was 1E7 to 2.5E10 Hz. The instrument reliably measured up to ~100-120 dB of shielding.

Figure 4:
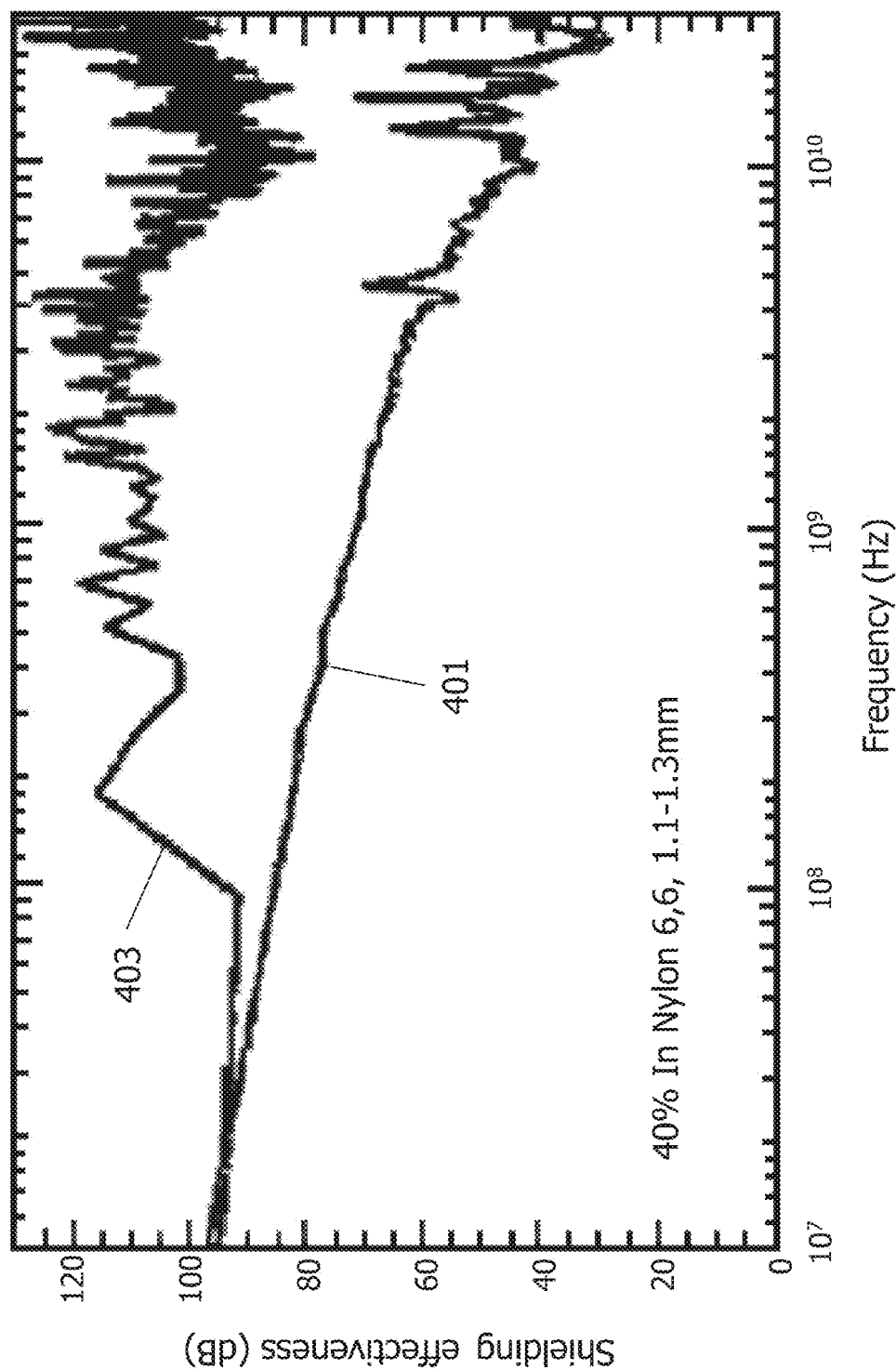
FIG. 4 shows a graphical representation of shielding effectiveness for composite formulations including dendritic and fibrous morphologies in a nylon resin, according to an embodiment of the disclosure.

However, referring to FIG. 4, the EMI shielding effectiveness of a fibrous sample 401 including fibrous particles loaded in nylon 6,6 at 40%, by volume, decreases as the frequency increases. For example, in one embodiment, the shielding effectiveness of the fibrous sample 401 decreases substantially throughout the frequency range of from 0.01 GHz to 25 GHz. In another embodiment, the EMI shielding effectiveness of the composite formulation 100 including the flakes 301 is maintained or substantially maintained as the frequency increases, such as, for example, over the frequency range of from 0.01 GHz to 25 GHz. Without wishing to be bound by theory, it is believed that the tendency of the flakes 301 to stack, as compared to the fibers, increases overlapping of particles in the composite formulation 100. The increase in overlapping particles decreases apertures between particles, which decreases the passage of higher frequency EMI through the conductive composite 100 to maintain or substantially maintain the shielding effectiveness at higher frequencies.

In contrast to the flakes 301 and/or fibrous particles, which substantially maintain or exhibit decreasing EMI shielding effectiveness, the EMI shielding effectiveness of a dendritic sample 403 including the dendritic particles 201 loaded in nylon 6,6 at 40%, by volume, increases as the frequency increases. In FIG. 4, the increase appears minimal because the shielding effectiveness of the sample has reached the maximum shielding effectiveness that the test instrument was able to measure. The increase in shielding effectiveness with frequency is more apparent in FIG. 5. Although the EMI shielding effectiveness of the dendritic sample 403 is shown in FIG. 4 as being slightly lower than that of the fibrous sample 401 at the lower end of the frequency range, the disclosure is not so limited and may include composite formulations 100 with dendritic particles 201 that provide comparatively increased EMI shielding effectiveness at the low frequency range as well.

Figure 5:
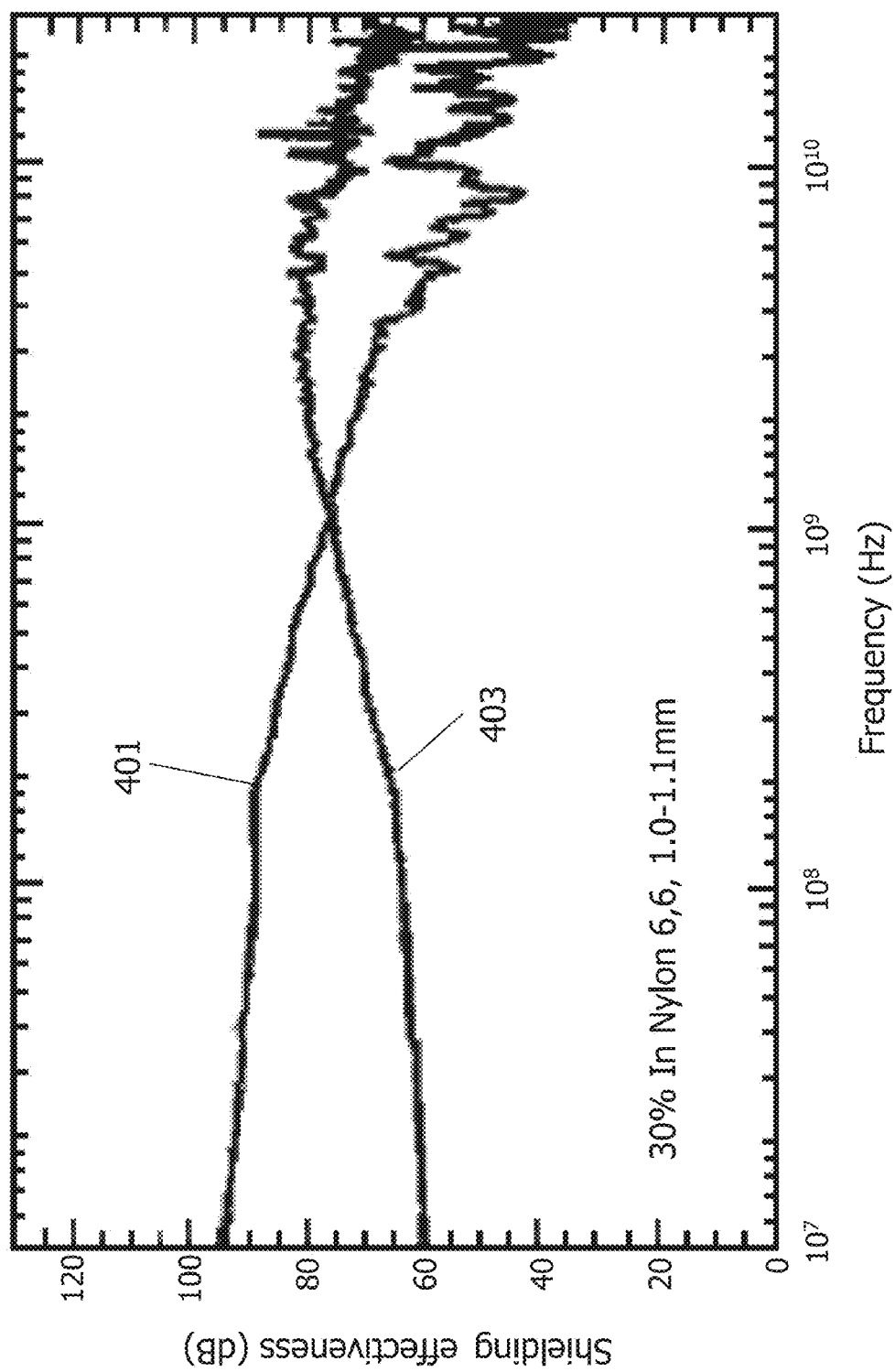
FIG. 5 shows a graphical representation of shielding effectiveness for composite formulations including dendritic and fibrous morphologies in a nylon resin, according to another embodiment of the disclosure.
Figure 6:
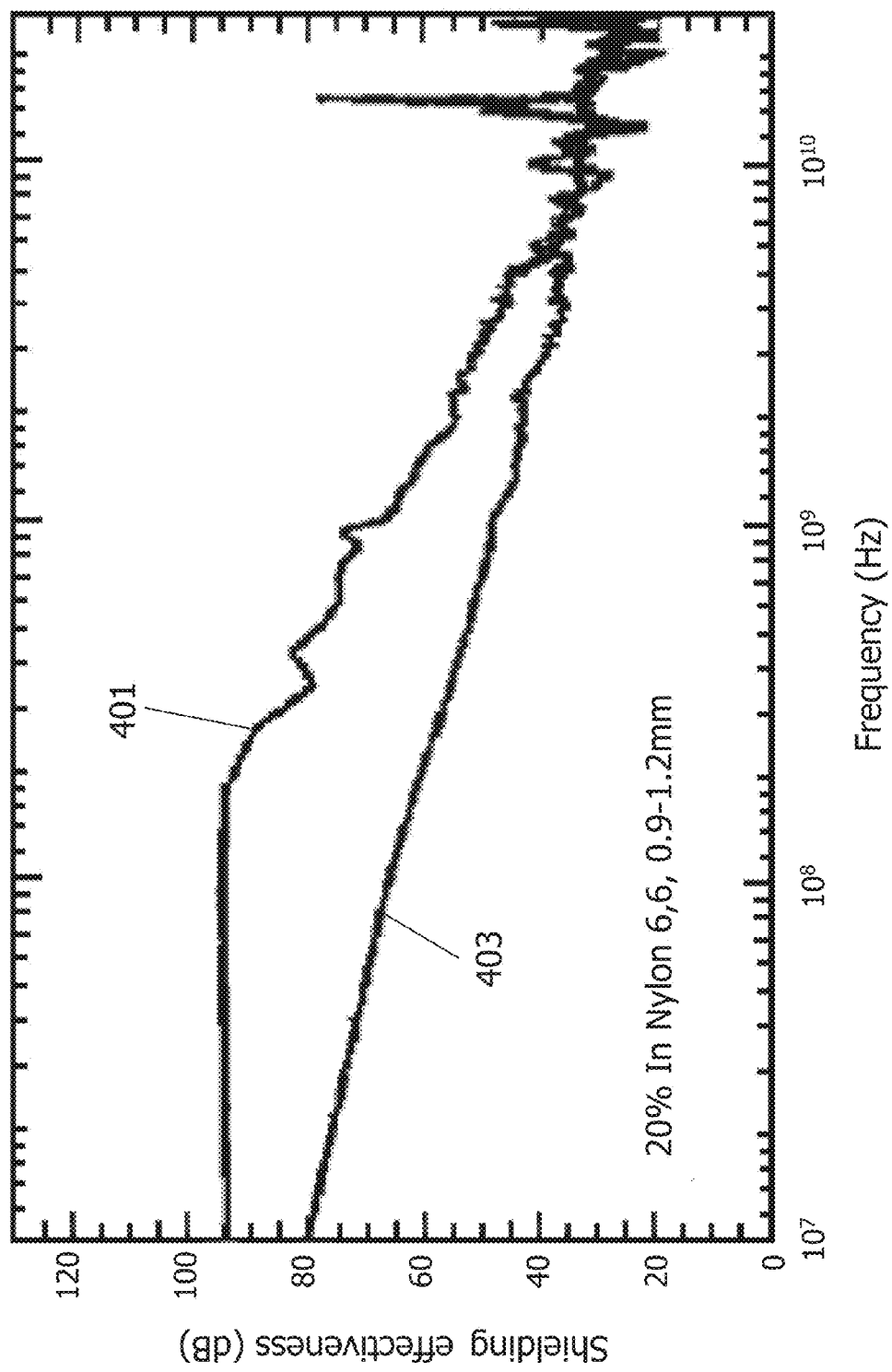
FIG. 6 shows a graphical representation of shielding effectiveness for composite formulations including dendritic and fibrous morphologies in a nylon resin, according to another embodiment of the disclosure.
Figure 7:
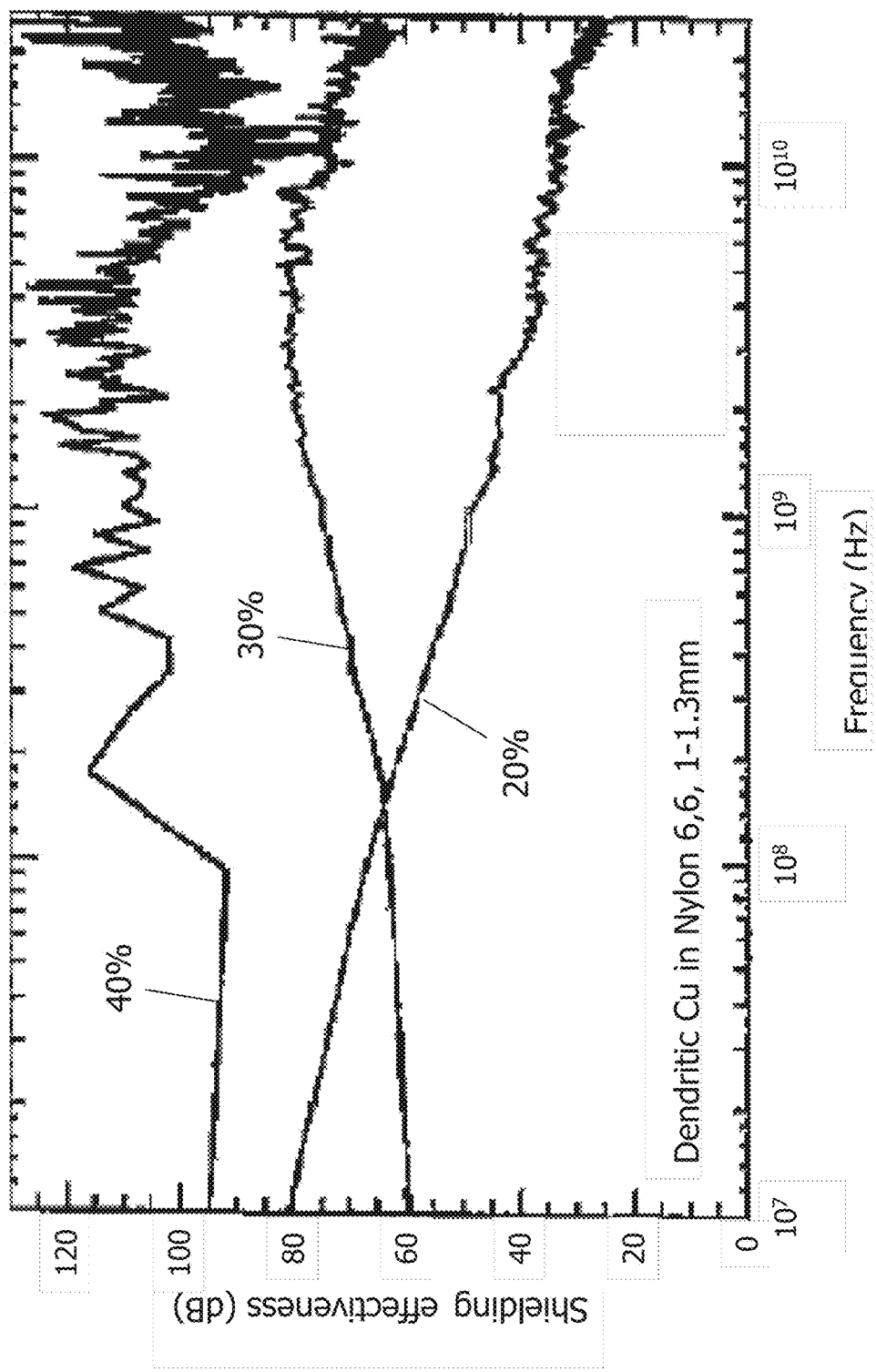
FIG. 7 shows a graphical representation of shielding effectiveness for composite formulations including dendritic morphologies in a nylon resin, according to an embodiment of the disclosure.
Figure 8:
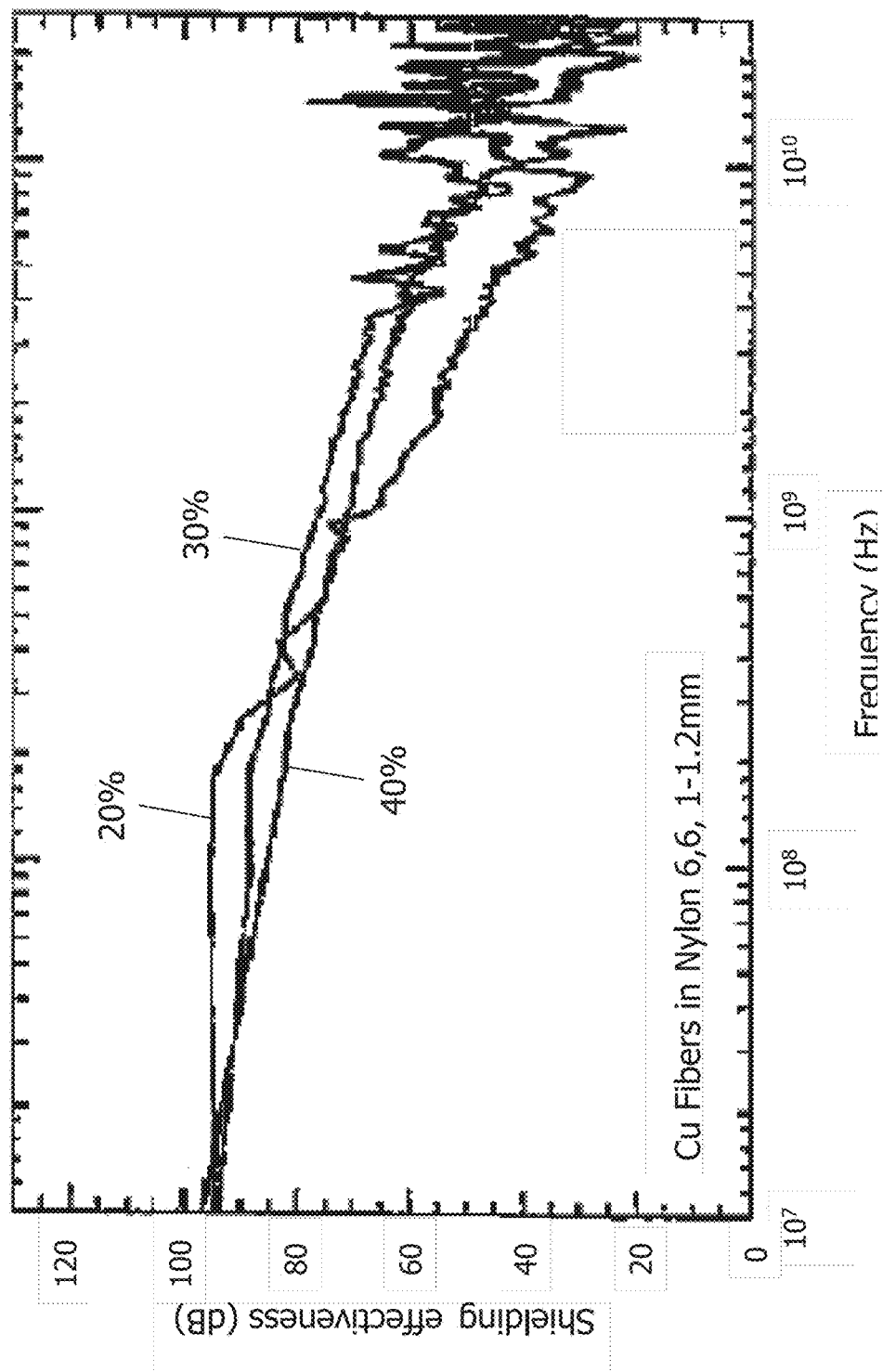
FIG. 8 shows a graphical representation of shielding effectiveness for composite formulations including fibrous morphologies in a nylon resin, according to an embodiment of the disclosure.

In one embodiment, as illustrated in FIGS. 4-7, decreasing the concentration of the dendritic particles 201 decreases the EMI shielding effectiveness throughout the range of frequencies shown. Referring to FIGS. 5 and 7, in one embodiment, although decreasing the concentration of the dendritic particles 201 from 40% to 30%, by volume, decreases the EMI shielding effectiveness between 0.01 GHz and 25 GHz, the dendritic sample 403 including 30%, by volume, dendritic particles 201 still exhibits an increase in EMI shielding effectiveness as higher frequencies. Alternatively, as illustrated in FIGS. 6-7, decreasing the concentration of the dendritic particles 201 to 20%, by volume, both decreases overall EMI shielding effectiveness and eliminates the increase in EMI shielding effectiveness at higher frequencies. This is likely a result of the loading being close to the percolation threshold of the dendritic particles, which is near 20%, by volume.

The composite formulation 100 formed according to one or more of the embodiments disclosed herein is processable using standard polymer processing techniques, including injection molding and/or extrusion. In one embodiment, the extrusion process provides a thickness of the composite formulation 100. In another embodiment, after extrusion, the composite formulation 100 is pressed and/or otherwise processed to provide the thickness or shape. Suitable thicknesses of the composite formulation 100 include, but are not limited to, up to 0.25 mm (about 10 mil), up to 0.5 mm (about 20 mil), up to 0.75 mm, up to 1.0 mm, up to 5.0 mm, up to 10 mm, at least 0.5 mm, at least 1.0 mm, at least 5.0 mm, at least 10 mm, between 0.076 mm (about 3 mil) and 10.0 mm, between 0.076 mm and 3.0 mm, between 0.076 mm and 2.0 mm, between 0.1 mm and 3.0 mm, between 0.1 mm and 2.0 mm, between 0.25 mm and 2.0 mm, between 0.25 mm and 1.0 mm, between 0.25 mm and 0.75 mm, between 0.25 mm and 0.5 mm, between 0.25 mm and 0.3 mm, or any combination, sub-combination, range, or sub-range thereof. In a further embodiment, increased thickness of the composite formulation 100 provides increased EMI shielding effectiveness.

Figure 9:
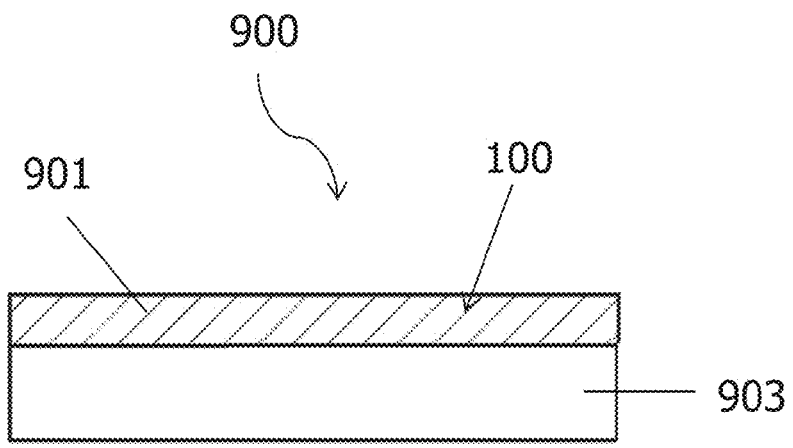
FIG. 9 shows a schematic view of a composite article, according to an embodiment of the disclosure.

Turning to FIG. 9, in one embodiment, a composite article 900 includes a single layer 901 of the composite formulation 100 formed over any suitable component 903 or as a standalone component. Although shown as including a rectangular geometry, as will be appreciated by those skilled in the art, the geometry of the composite article 900 and the component 903 is not so limited and may include any other suitable geometry. For example, the composite article 900 and/or the component 903 may include a connector housing, a gasket, tubing, any suitable complex geometry, or a combination thereof.

The conductive particles 103 (see FIG. 1) in the single layer 901 of the composite formulation 100 include any suitable morphology and/or combination of morphologies, such as dendritic 201, fibrous, and/or flakes 301, to provide the desired conductivity and/or EMI shielding properties. The one or more morphologies may be evenly distributed within the concentration of conductive particles 103, or the distribution may differ between morphologies. For example, the conductive particles 103 at a concentration of between 20% and 50%, by volume, may include 50% dendritic particles 201 and 50% fibrous particles. In another example, the conductive particles 103 include between 5% and 95% dendritic particles 201, and between 5% and 95% fibrous particles. In another example, the distribution of morphologies within the conductive particles 103 includes 33.3% dendritic particles 201, 33.3% fibrous particles, and 33.3% flakes 301. Other distributions include any suitable amount of each morphology to provide the desired concentration of the conductive particles 103.

Figure 10:
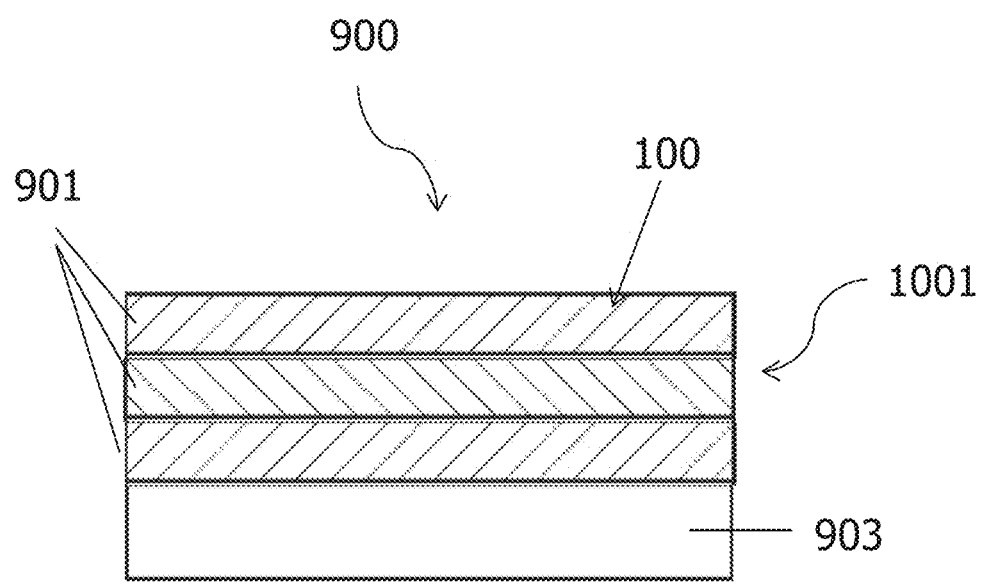
FIG. 10 shows a schematic view of a composite article, according to an embodiment of the disclosure.

Additionally or alternatively, as illustrated in FIG. 10, the composite article 900 includes two or more layers 901 of the composite formulation 100 formed over any suitable component 903 or as a standalone component. The two or more layers 901 form a stack 1001, with the composite formulation 100 in each of the two or more layers 901 including the same, substantially the same, or different conductive particles 103 having the same, substantially the same, or different morphologies. For example, in one embodiment, the composite formulation 100 in each of the two or more layers 901 includes the conductive particles 103 having a combination of fibrous, dendritic 201, and/or flake 301 morphologies. In another embodiment, the composite formulation 100 in one of the two or more layers 901 includes one of the morphologies, and the composite formulation 100 in at least one of the other layers 901 includes a different morphology.

Figure 11:
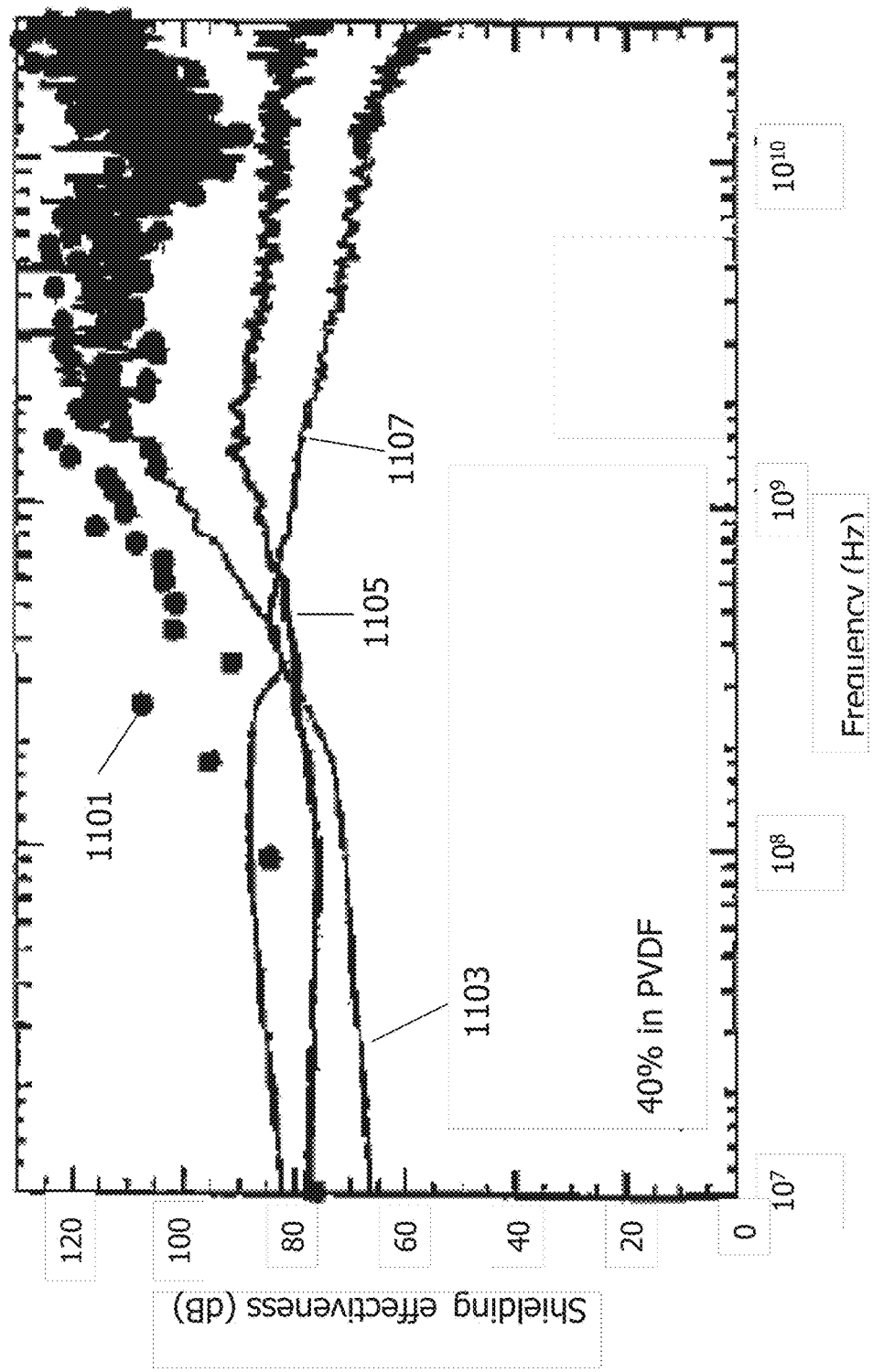
FIG. 11 shows a graphical representation of shielding effectiveness for composite formulations including dendritic morphologies, fibrous morphologies, and combinations thereof in a PVDF resin, according to an embodiment of the disclosure.

The combination of morphologies within one of the layers 901 and/or the stack 1001 provides high and/or consistent shielding effectiveness over a wide range of frequencies. In one embodiment, the combination of morphologies within the single layers 901 and/or the stack 1001 provide increased and/or more consistent EMI shielding effectiveness over a range of frequencies, as compared to the composite formulation 100 including any of the individual morphologies in isolation. For example, as illustrated in FIG. 11, a mixed morphology layer 1101 including 50% dendritic copper and 50% fibrous copper (0.6 mm thick), as well as a stacked morphology 1105 including stacked layers of dendritic copper and fibrous copper (0.7 mm thick in total), provide increased EMI shielding effectiveness over a range of frequencies as compared to a dendritic layer of copper 1103 (0.5 mm thick) and a fibrous layer of copper 1107 (0.6 mm thick). The stacked morphology 1105 exhibits more consistent EMI shielding effectiveness compared to the dendritic layer 1103 and copper layer 1107. In another embodiment, the combination of morphologies within one layer 901 and/or the stack 1001 provide high EMI shielding effectiveness at total thicknesses of at least 0.10 mm, less than 0.25 mm, less than 0.5 mm, less than 0.75 mm, less than 1.0 mm, between 0.25 mm and 1.0 mm, between 0.25 mm and 0.75 mm, between 0.25 mm and 0.5 mm, between 0.25 mm and 0.3 mm, or any combination, sub-combination, range, or sub-range thereof.

According to one or more of the embodiments disclosed herein, the composite formulation 100 and/or the composite article 900 provide high, frequency-independent EMI shielding effectiveness. Additionally, the polymer matrix 101 and the conductive particles 103 described herein provide a moldable and/or extrudable composite formulation 100 that includes increased mechanical durability, increased heat stability, and/or decreased cost. Furthermore, as compared to existing metallic shielding materials, the composite article 400 including the composite formulation 100 include increased EMI shielding effectiveness at decreased weight, increase processability of EMI shielding materials, facilitate the formation of composite articles 900 having increased geometric complexity, or a combination thereof.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A composite article, comprising
   at least two layers of a composite formulation, the composite formulation of each layer including a thermoplastic polymer matrix and conductive particles distributed within the polymer matrix, the conductive particles including a concentration of, by volume, between 20% and 50% of the composite formulation; wherein the conductive particles comprise tin-coated copper particles having a copper/tin volume ratio of between 3/1 and 3/2;
   wherein the conductive particles in each of the at least two layers include at least one morphology selected from the group consisting of fibrous, dendritic, and flake; and
   wherein the morphology of the conductive particles in one of the at least two layers differs from the morphology of the conductive particles in another one of the at least two layers.

2. The composite article of claim 1, wherein the composite formulation provides an electromagnetic shielding effectiveness of at least 40 dB over a frequency range of from 0.01 GHz to 25 GHz.

3. The composite article of claim 1, wherein the thermoplastic polymer matrix is selected from the group consisting of a polyamide (PA), a polyvinylidene fluoride (PVDF), and a combination thereof.

4. The composite article of claim 1, wherein the concentration of the conductive particles consists of, by volume, between 30% and 45%.

5. The composite article of claim 1, wherein the composite formulation is electrically conductive, having a resistivity of between $10^{-1}$ Ω-cm and $10^{-5}$ Ω-cm.

6. The composite article of claim 1, wherein the composite formulation is extrudable.

7. The composite article of claim 1, wherein the composite formulation is moldable.

8. The composite article of claim 1, wherein a combined thickness of the at least two layers is equal to or less than 0.75 mm.

9. The composite article of claim 1, further comprising a component, the at least two layers of the composite formulation being positioned on a surface of the component.

* * * * *